(12) United States Patent
Eslambolchi et al.

(10) Patent No.: US 6,741,081 B1
(45) Date of Patent: May 25, 2004

(54) CABLE FAULT DETECTOR

(75) Inventors: Hossein Eslambolchi, Los Altos Hills, CA (US); John Sinclair Huffman, Conyers, GA (US)

(73) Assignee: AT&T Corp., New York, NY (US)

( * ) Notice: Subject to any disclaimer, the term of this patent is extended or adjusted under 35 U.S.C. 154(b) by 0 days.

(21) Appl. No.: 10/379,020

(22) Filed: Mar. 4, 2003

(51) Int. Cl.$^7$ ................................ H01H 31/02
(52) U.S. Cl. ................ 324/541; 324/544; 324/530; 324/509
(58) Field of Search ............... 324/541, 544, 324/530, 509, 510, 512, 539, 543, 513, 127, 126

(56) References Cited

U.S. PATENT DOCUMENTS

| | | | | |
|---|---|---|---|---|
| 2,894,204 A | * | 7/1959 | Gambrill | 324/515 |
| 3,310,735 A | * | 3/1967 | Peschel | 324/517 |
| 3,988,666 A | * | 10/1976 | Rowland et al. | 324/515 |
| 4,477,769 A | * | 10/1984 | Lowery et al. | 324/517 |
| 4,988,949 A | * | 1/1991 | Boenning et al. | 324/541 |
| 5,644,237 A | | 7/1997 | Eslambolchi et al. | |

* cited by examiner

Primary Examiner—Evan Pert
Assistant Examiner—Jimmy Nguyen

(57) ABSTRACT

The present invention is a apparatus and method for accurately finding a location of a fault in a fiber cable where a cable locating current is leaking to ground. The system includes a sensor body, voltage probes mounted in the body to face the cable, a reference voltage input and a voltage comparator that compares the reference voltage to a measured voltage at the probes. Use of the system may include applying a conductive medium such as a conductive gel between the probes and the cable.

19 Claims, 2 Drawing Sheets

CABLE FAULT DETECTOR

FIELD OF THE INVENTION

The present invention relates generally to the repair of systems using a cable locating current for determining the position of underground cables from above ground. More particularly, the present invention is an apparatus and method for finding a fault in a cable sheath that is causing the cable locating current to leak to ground.

BACKGROUND OF THE INVENTION

Many utilities bury pipes and cables ("utility conveyances" or "conveyances") underground for reasons of both safety and aesthetics. Underground burial often provides protection to utility conveyances against weather and other sources of potential damage. Utilities that undertake burial of their conveyances usually make extensive efforts to plot the location of each buried conveyance on a map to facilitate its location in case of repair or replacement. While a map will indicate the general location of a buried conveyance, more precise location information often becomes necessary, particularly in urban environments. For that reason, most utilities that bury their conveyances underground rely on electromagnetic signaling techniques to precisely locate such conveyances.

U.S. Pat. No. 5,644,237, issued Jul. 1, 1997 and incorporated herein by reference in its entirety, describes a principle for electromagnetic signaling for locating a buried utility conveyance. To locate a buried conveyance, a locating tone or signal is applied to a metallic component of the conveyance. In one currently used embodiment, the signal is an AC signal between 80 and 120 volts and having a frequency of from 220 to 440 Hz. As shown in FIG. 1, in the case of a cable 100 containing fiber optic bundles 110, a cable locating conductor may be included in the cable as a metallic sheath 120 or a copper tracer wire (not shown) within an insulating sheath 130 surrounding the cable. Using a signal detector of a type well known in the art, a technician locates the conveyance by operating the detector above ground to detect a signal generated by current passing through the cable locating conductor.

In addition to the AC locating tone, a DC cable locating signal is also sometimes used in conjunction with a vector bar detector in order to confirm the information from the AC signal. The DC signal in a currently used system is approximately 80 to 100 volts.

The cable sheath or insulating sheath 130 surrounds the cable locating conductor in the buried cable and insulates the conductor from ground. The insulating sheath is applied during the cable manufacturing process, and is formed from a durable, flexible insulating material such as polypropylene. In one commonly used fiber optic cable, the sheath 130 has a thickness 138 of approximately ⅛ inch.

The insulating sheath of an underground cable has been known to contain cable sheath faults such as fault 135 caused by cracking, puncturing or preexisting manufacturing defects. Those faults may permit water or other conducting media to penetrate the cable, providing a ground path from the cable locating conductor within the sheath. Sheath faults are most common in locations where a cable is bent to a relatively small radius, such as within manholes or splice boxes, where extra cable length is commonly wrapped or coiled for later use in repairs or maintenance.

A cable sheath fault, once located, can often be repaired by resealing the sheath in the area immediately surrounding the fault. One commonly used method for repairing a sheath fault is by wrapping a sealing tape around the area that includes the fault, thereby sealing the leak. The tape may be a poly material and may include an adhesive designed to withstand moisture and to adhere securely to the sheath.

Cable sheath faults that are leaking current to ground may be roughly located using outside plant fault detection equipment as is known in the art. For example, a drop in the cable locating signal received above ground usually indicates the presence of a ground fault in that general area. Those techniques are effective in isolating a sheath fault to a certain manhole or splice box. The exact location of a cable sheath fault along a cable is, however, very difficult to pinpoint even after it has been isolated to a specific manhole or splice box. Manholes often fill with rainwater, submerging the cable. When a cable is pulled from the water, current flow to ground will often cease, making the fault difficult to pinpoint. In many cases, the fault is not visible on the sheath because the defect is extremely small or because a crack in the sheath partially closes when the cable is unwound from a splice box.

One technique frequently used by an outside plant technician is to feel along the cable for any imperfection in the sheath. Often, before the fault is detectable in that manner, the fault must deteriorate significantly. That deterioration also makes it impossible to use the cable locating current to locate the cable underground in the event of a third party dig alert, cable maintenance, cable repairs, etc. If a technician is not successful in pinpointing the fault either tactilely or visually, it is not possible to repair the sheath at the fault location. In those cases, entire sections of cable, typically hundreds of feet between splices, must be replaced.

There is therefore presently a need for a method and apparatus for locating a sheath fault on a cable such as a fiber cable, with sufficient precision to repair the fault without replacing the entire section. To the inventors' knowledge, there is currently no such apparatus or method currently employed to satisfactorily accomplish that task.

SUMMARY OF THE INVENTION

The present invention addresses the needs described above by providing a an apparatus and a method for locating on an optical fiber cable a fault where a cable locating current is leaking to ground. One embodiment of the invention is an apparatus for locating such cable faults. The apparatus includes a body adapted to be positioned adjacent the cable, at least one voltage probe mounted in the body and positioned in the body to probe the leaking cable locating current, a reference voltage input for receiving a reference voltage, and a voltage comparator electrically connected to the at least one voltage probe and to the reference voltage input, the comparator configured for measuring a test voltage between the reference voltage and the at least one voltage probe.

The body may further be adapted to at least partially surround a transverse section of the cable. In that case the at least one voltage probe may be a plurality of voltage probes angularly spaced around the transverse section of the cable. The at least one voltage probe preferably presents a conductive surface facing the cable.

The reference voltage may be ground, or may be a DC voltage applied to the cable.

In another embodiment of the invention, a method is provided for locating on a cable a fault where a cable locating current is leaking to ground. The method includes the steps of positioning a voltage probe adjacent the cable, applying a conductive medium between the cable and the voltage probe, displacing the voltage probe along the cable, measuring a voltage between the voltage probe and a reference voltage, and, based on the voltage, detecting the fault at a position of the voltage probe along the cable.

The conductive medium may be water, a water-based paste or a gel. The voltage probe may include a plurality of conductive surfaces facing the cable. In that case, the step of positioning a voltage probe adjacent the cable may include at least partially surrounding the cable with the voltage probe.

The step of displacing the voltage probe along the cable preferably includes maintaining the probe in a position at least partially surrounding the cable. The step of measuring a voltage between the voltage probe and a reference voltage includes measuring a voltage between the voltage probe and ground.

The method may further include the step of applying a reference DC voltage to the cable. In that case, the step of measuring a voltage between the voltage probe and a reference voltage includes measuring a voltage between the voltage probe and the reference DC voltage.

The method may include the step of sounding an alarm when the fault is detected. An initial step may be included to determine an approximate position of the fault by determining a position along the cable where an above-ground detectability of the cable locating current degrades.

The step of detecting the fault may include detecting a drop in the measured voltage, or it may include detecting an increase in the measured voltage.

DESCRIPTION OF THE INVENTION

Figure 1:
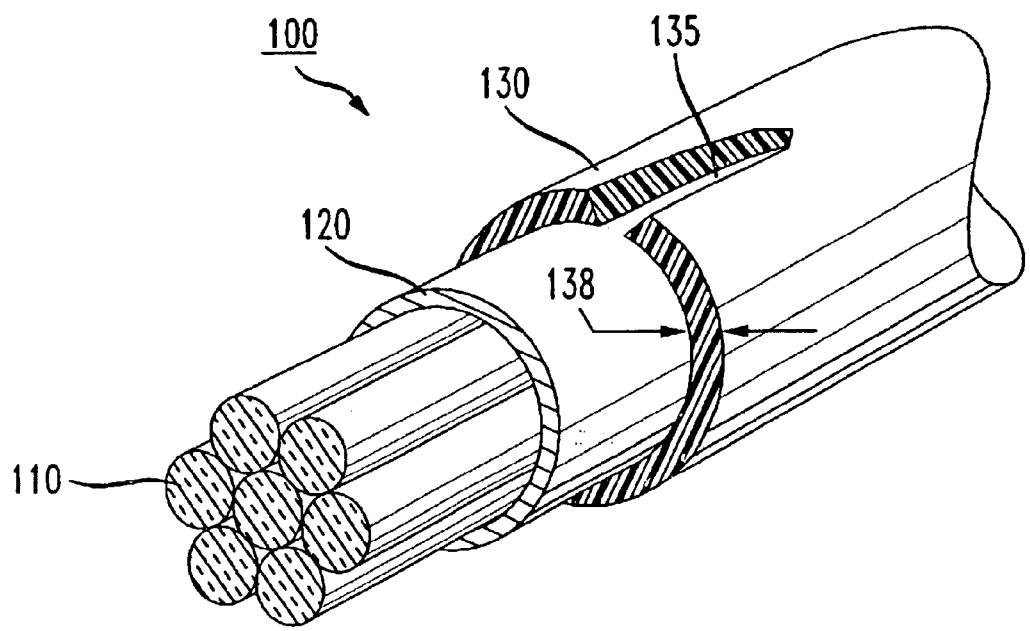
FIG. 1 is a sectional view of an underground cable with a sheath fault.
Figure 2:
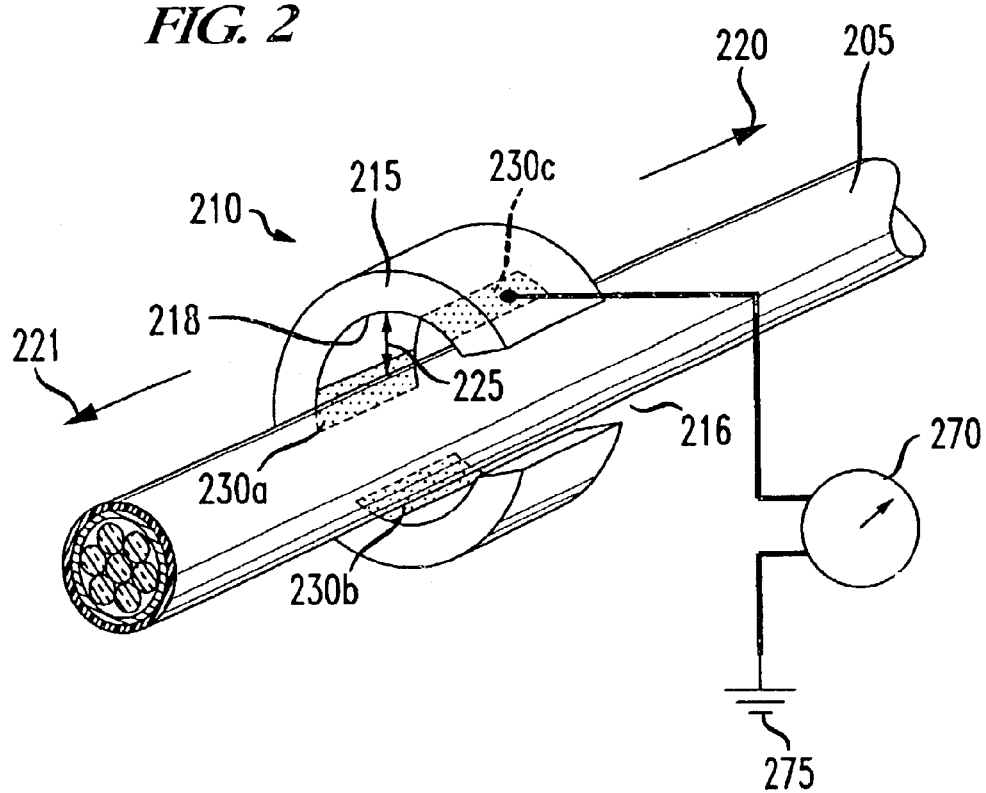
FIG. 2 is a view of an apparatus for locating sheath faults according to the invention.

An apparatus for precisely locating a cable sheath fault according to the present invention is shown in FIG. 2. The apparatus comprises a test set 210 that an outside plant technician may place around a cable 205, and a voltage comparator 270 for sensing electrical potential that may be present between the cable 205 and a reference voltage such as ground 275.

In a currently preferred embodiment of the invention, the test set 210 comprises a generally cylindrical body 215 that includes a slot or open area 216. The slot 216 is large enough to permit the cable 205 to be inserted within the body 215 and placed adjacent an inner surface 218 of the body. The body may then be translated by a technician in directions 220, 221 parallel to an axis of the cable 205 to test for sheath defects along a length of the cable. The inner surface 218 of the body has a sufficiently large diameter to leave a gap 225 of approximately 0.5–1.5 inches of clearance between the surface and the exterior of the cable 205. The body 215 is preferably configured to at least partially surround the cable in a transverse plane, in order to facilitate moving the body along the cable, and to increase the surface area of the cable that is inspected as the body is translated along the cable.

The body 215 is equipped with at least one voltage sensor such as sensors 230a, 230b, 230c fixed to the inner surface 218 of the body 215. The voltage sensors present conductive surfaces facing the cable 205 in order to establish electrical continuity between the sensors and the cable. The illustrated embodiment includes three voltage sensors 230 that are equally spaced around the circumference of the cable 205 in order to further enhance continuity. One skilled in the art will recognize that other sensor configurations may be used without departing from the spirit or operation of the invention.

As discussed above, cable faults are frequently found on cable lengths that have been wrapped or wound within a manhole or splice box. Those environments are frequently filled with rainwater or ground water. That water may provide a conductive path across the gap 225 between the exterior surface of the cable 205 and the sensors 230. If conditions are dry, or if a more sensitive measurement is required, a conductive material such as a gel or water based paste (not shown) may be applied to the cable to fill the gap 225 and provide an enhanced conductive path.

The voltage comparator 270 measures electrical potential between the sensors 230 and some reference voltage. In the illustrated embodiment of the invention, the voltage is measured to ground 275. That measurement is conveniently carried out by a technician because a ground connection is almost always available at the site.

In another embodiment of the invention, a reference voltage is applied to the cable conductive element in addition to the cable locating tone. The reference voltage may be a DC signal or may be an AC signal having a different frequency than that of the cable locating tone. While less convenient than using a ground reference, the use of a delivered reference voltage assures that ambient electrical potential that might be present in the local ground does not affect the measurement. The apparatus of the invention may be configured to use both reference voltage sources. Other reference voltage sources may be used without departing from the scope of the invention.

The voltage comparator 270 may be equipped with a visual, audible or other signal indicating the presence of a fault. Depending on the reference voltage used, the signal may alert the technician to a sudden drop or rise in voltage, or both.

Figure 3:
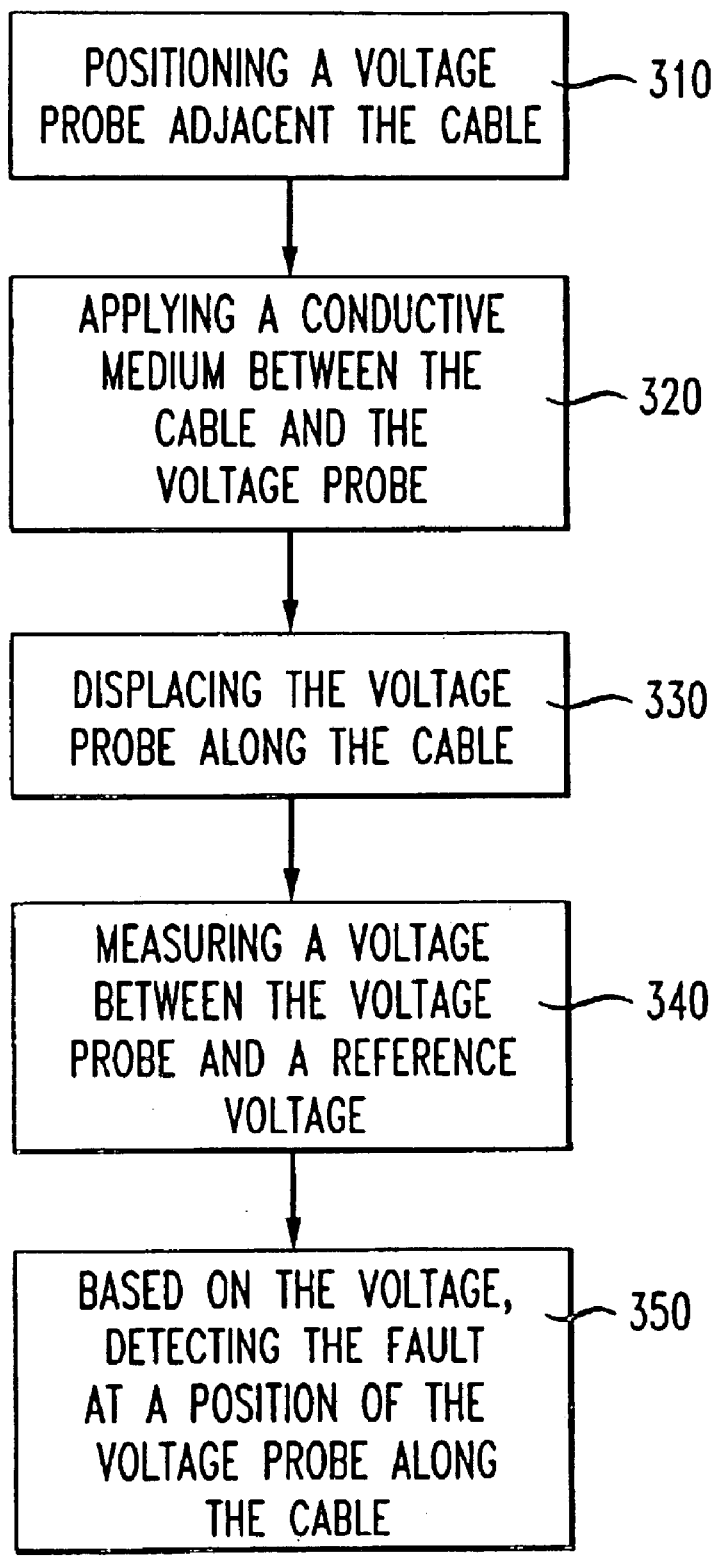
FIG. 3 is a flow chart illustrating a method for locating sheath faults according to the invention.

A method 300 for locating a fault on an optical fiber cable according to one embodiment of the invention is illustrated in FIG. 3. The method is typically performed at a location such as a splice box or manhole where a fault is suspected. The general location may have been determined using above ground fault detection equipment. A voltage probe is positioned (step 310) adjacent the cable. A body containing one or more probes may be placed directly on the cable as shown in FIG. 2, or may be of a type that must first be opened in order to insert the cable. To improve the conductive path between the probe and the cable, a conductive medium may be applied (step 320) between the cable and the voltage probe. That medium may be water, a water-based paste, or a gel. The conductive medium may be applied to the probe, to the cable or to both, and may be applied either before or after the probe is placed on the cable.

The voltage probe is displaced (step 330) along the cable in order to determine the exact location of the sheath fault. As the probe is moved, a voltage is measured (step 340) between the voltage probe and a reference voltage. As noted above, the reference voltage may be ground or may be a voltage provided on the cable locating conductor.

Based on the voltage, the fault is detected (step 350) at the position of the voltage probe along the cable. The fault may be signaled to the technician by an alarm or signal indicating a sudden change in voltage as detected by the voltage comparator.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. For example, while the system is described as having a cylindrical body with circumferentially spaced probes, other shapes and probe configurations may be used while remaining within the scope of the invention. For example, the body may be toroidal, horseshoe-shaped, or may simply be a handle for presenting the probes. It is to be understood that the embodiments shown and described herein are only illustrative of the principles of the present invention and that various modifications may be implemented by those skilled in the art without departing from the scope and spirit of the invention.

What is claimed is:

1. An apparatus for locating on an optical fiber cable a fault where a cable locating current is leaking to ground, the apparatus comprising:
   a body adapted to be positioned adjacent the cable;
   at least one voltage probe mounted in the body and positioned in the body to probe the leaking cable locating current;
   a reference voltage input for receiving a reference voltage; and
   a voltage comparator electrically connected to the at least one voltage probe and to the reference voltage input, the comparator configured for measuring a test voltage between the reference voltage and the at least one voltage probe.

2. The apparatus of claim 1, wherein the body is further adapted to at least partially surround a transverse section of the cable.

3. The apparatus of claim 2, wherein the at least one voltage probe comprises a plurality of voltage probes angularly spaced around the transverse section of the cable.

4. The apparatus of claim 1, wherein the at least one voltage probe presents a conductive surface facing the cable.

5. The apparatus of claim 1, wherein the reference voltage is ground.

6. The apparatus of claim 1, wherein the reference voltage is a DC voltage applied to the cable.

7. A method for locating on a cable a fault where a cable locating current is leaking to ground, the method comprising the steps of:
   positioning a voltage probe adjacent the cable;
   applying a conductive medium between the cable and the voltage probe;
   displacing the voltage probe along the cable;
   measuring a voltage between the voltage probe and a reference voltage; and
   based on the voltage, detecting the fault at a position of the voltage probe along the cable.

8. The method of claim 7, wherein the conductive medium is water.

9. The method of claim 7, wherein the conductive medium is a water-based paste.

10. The method of claim 7, wherein the conductive medium is a gel.

11. The method of claim 7, wherein the voltage probe comprises a plurality of conductive surfaces facing the cable.

12. The method of claim 11, wherein the step of positioning a voltage probe adjacent the cable includes at least partially surrounding the cable with the voltage probe.

13. The method of claim 12, wherein the step of displacing the voltage probe along the cable comprises maintaining the probe in a position at least partially surrounding the cable.

14. The method of claim 7, wherein the step of measuring a voltage between the voltage probe and a reference voltage includes measuring a voltage between the voltage probe and ground.

15. The method of claim 7, further comprising the step of applying a reference DC voltage to the cable, and wherein the step of measuring a voltage between the voltage probe and a reference voltage includes measuring a voltage between the voltage probe and the reference DC voltage.

16. The method of claim 7, further comprising the step of sounding an alarm when the fault is detected.

17. The method of claim 7, further comprising the step of initially determining an approximate position of the fault by determining a position along the cable where an above-ground detectability of the cable locating current degrades.

18. The method of claim 7, wherein the step of detecting the fault comprises detecting a drop in the measured voltage.

19. The method of claim 7, wherein the step of detecting the fault comprises detecting an increase in the measured voltage.

* * * * *